US006467151B1

(12) United States Patent
Watanabe et al.

(10) Patent No.: US 6,467,151 B1
(45) Date of Patent: Oct. 22, 2002

(54) METHOD OF PRODUCING A SUPERCONDUCTING MAGNET

(75) Inventors: Kazuo Watanabe, Iwanuma; Mitsuhiro Motokawa, Sendai, both of (JP)

(73) Assignee: Tohoku University, Sendai (JP)

( * ) Notice: Subject to any disclaimer, the term of this patent is extended or adjusted under 35 U.S.C. 154(b) by 0 days.

(21) Appl. No.: 09/353,412

(22) Filed: Jul. 15, 1999

(30) Foreign Application Priority Data

Nov. 30, 1998 (JP) .......................................... 10-339134

(51) Int. Cl.[7] ............................................... H01L 39/24

(52) U.S. Cl. .......................... 29/599; 29/602.1; 29/605; 505/431

(58) Field of Search ............................... 29/599, 602.1, 29/605; 505/433, 431

(56) References Cited

U.S. PATENT DOCUMENTS

| | | | | | |
|---|---|---|---|---|---|
| 3,509,622 | A | * | 5/1970 | Bernert et al. | |
| 3,905,839 | A | * | 9/1975 | Hashimoto | |
| 3,958,327 | A | * | 5/1976 | Marancik et al. | |
| 3,996,661 | A | * | 12/1976 | Ziegler et al. | |
| 4,242,536 | A | * | 12/1980 | Young | |
| 4,743,713 | A | * | 5/1988 | Scanlan | |
| 5,501,746 | A | * | 3/1996 | Egawa et al. | 29/599 |
| 5,508,254 | A | * | 4/1996 | Sato et al. | 29/599 |

FOREIGN PATENT DOCUMENTS

| | | |
|---|---|---|
| JP | 61-104508 | 7/1986 |
| JP | 63-232405 | 9/1988 |
| JP | 1-133307 | 5/1989 |
| JP | 6-53037 | 2/1994 |
| JP | 06-224037 | 8/1994 |
| JP | 09-289112 | 11/1997 |
| JP | 10-027707 | 1/1998 |

* cited by examiner

*Primary Examiner*—Carl J. Arbes
(74) *Attorney, Agent, or Firm*—Knobbe, Martens, Olosn & Bear, LLP

(57) ABSTRACT

A superconducting magnet comprised of a reinforced and stabilized superconducting wire material which is wound into an electromagnetic coil. The superconducting wire material comprises a compound superconducting substance, and a reinforcing, stabilizing agent which covers said compound superconducting substance. The superconducting magnet can be produced without requiring a specifically designed heat treatment furnace, and is light in weight and capable of generating a high magnetic field.

10 Claims, 2 Drawing Sheets

METHOD OF PRODUCING A SUPERCONDUCTING MAGNET

BACKGROUND OF THE INVENTION

1. Field of the Invention

The present invention relates to a superconducting magnet and a method of producing the same.

2. Description of Related Art

Commonly used superconducting magnet is generally classified into three different types: a magnet made of an alloy superconducting wire material represented by a niobium-titanium alloy; a magnet made of a compound superconducting wire material represented by a $Nb_3Sn$ compound; and a magnet made of a combination of the above two types. For a given application, those three types are selected as appropriate in accordance with their characteristics.

The alloy superconducting wire material has a good mechanical property as compared with the compound superconducting wire material, and thus it maintains the superconductivity until the stress reaches a yielding level of 250 to 300 MPa. Moreover, it can satisfactorily withstand a bending strain of up to 2%. Therefore, when an alloy superconducting wire material is wound into a coil to produce a magnet, it is possible to perform tightly wind the wire material without any interstice between adjacent windings under application of a tension to the wire, thereby facilitating production of a magnet from the wire material. For such a ground, the majority of previous superconducting magnets have been produced from the alloy wire material.

However, an alloy superconducting wire material does not exhibit a sufficient superconductivity, particularly a sufficiently high critical current at the critical magnetic field, or at a high magnetic field, as compared with the compound superconducting wire material. Thus, a superconducting magnet made of an alloy superconducting wire material exhibits a lower magnetic field than does a superconducting magnet made of a compound superconducting wire material. For example, a superconducting magnet made of a niobium-titanium alloy wire material, which is most commonly used as an alloy superconducting wire materials, generates, at the maximum, a magnetic field of 8–9 T (one T equals to 10000 Gaus) in the presence of a liquid helium maintained at 4.2K, and a magnetic field of 11—12 T even in the presence of superfluid liquid helium maintained at 1.8K. Accordingly, a superconducting magnet made of an alloy superconducting wire material would not meet the desired specification particularly for applications which require an even higher magnetic field, such as a magnet for a high-resolution magnetic resonance imaging (MRI) device, or a high field magnet for the measurement of physical properties of an object.

On the other hand, a superconducting magnet made of a compound superconducting wire material exhibits a high critical magnetic field as compared with a superconducting magnet made of an alloy superconducting wire material. For example, a magnet made of an $Nb_3Sn$ wire material generates, at the maximum, a magnetic field of about 18 T in the presence of liquid helium maintained at 4.2K, and a field of about 21 T when exposed to superfluid liquid helium of 1.8K, which are far above the maximum magnetic field expected from a superconducting magnet made of an alloy superconducting wire material. Therefore, a compound superconducting wire material is generally considered to be most suitable as a raw material for a superconducting magnet which allows the generation of a magnetic field of not less than 12 T. However, because a compound superconducting wire material is composed of a intermetallic compound, it is susceptible to mechanical stresses: its yielding stress is 150 MPa, or should be taken as 100 MPa for design purposes, and its tolerable bending strain should be taken as about 0.2% for design purposes. Accordingly, when producing a superconducting magnet from a compound superconducting wire material, it has been extremely difficult to employ a method in which the superconducting wire material is wound into a coil while applying a tension to the wire, as in the alloy superconducting wire material.

For producing a magnet from a compound superconducting wire material, it is important to avoid the introduction of strains into the compound superconducting wire material, which may occur in association with the winding process. To this end, the production process generally includes the steps of winding an unreacted compound superconducting material into a coil, subjecting the coil to a heat treatment so as to allow niobium and tin to react with each other to form an $Nb_3Sn$ compound (wind-and-react method), and then immersing an epoxy resin into interstices between adjacent windings in vacuum thereby to prevent undesired vibrations of the wire material, or to fix the coil. Therefore, the process for producing a magnet from a compound superconducting material requires specifically designed facilities for uniformly applying heat to the coil, or immersing a resin into the wire interstices under vacuum. Particularly, in order to produce a magnet for applications which require a wide-bore coil, a large heating furnace and a large vacuum coating facility are required.

It should be noted here that there is another method which allows the production of a superconducting magnet from a compound wire material, by using, instead of a conventional $Nb_3Sn$ wire material susceptible to strains, a previously heat-treated wire material and winding it into a coil, and which is known as a double pancake method. With this method, however, the tolerable limit of strains during the production process should also be 0.2% or less, in accordance with the property characteristic of the wire material to be used, and it is thus necessary for the resulting superconducting magnet to have a wide bore. This method further suffers from problems that not only the final shape the magnet is limited, but it is also difficult, if not impossible, to apply a high tension to the wire during its winding.

As described above, a compound superconducting magnet is conventionally produced by the wind-and-react method, except for the double pancake method, and, with this method, a specifically designed facility must be introduced for the thermal treatment which is necessary for transforming the starting materials into an $Nb_3Sn$ compound and winding the compound into a coil. With this method it is also necessary to carefully handle the wire after thermal treatment in order that any undue strains and stresses may not be added into the wire. In addition, this method also requires a vacuum coating device for applying an epoxy resin and fixing the wire material.

For production of a wide-bore magnet generating a strong magnetic field, there is an actual demand for the introduction of a compound superconducting wire material which is capable of generating a strong magnetic field. This applies, for example, to a wide-bore and strong field magnet for the measurement of physical properties of an object, or a superconducting magnet for particle accelerators, for linear motor cars, for electric generators, or for elementary particle detectors. However, a compound superconducting magnet prepared by the conventional method poses a number of problems: a compound superconducting magnet produced by the conventional method can not help being large; the magnet must incorporate a large-caliber superconducting wire material to withstand the magnetic force it produces, and the large-caliber wire inevitably leads to a further enlarged coil diameter; and the production of the magnet itself is difficult. Thus, use of such a compound superconducting wire material is practically impossible at present.

When a wide-bore superconducting magnet is introduced, for example, in a particle accelerator, the overall facility becomes large in scale. Therefore, it is desirable to realize a magnet which is made as compact as possible. For production of a cryocooled superconducting magnet which does not require liquid helium, it is essential for the magnet to be small in size and light in weight besides that the superconducting magnet must be easy for production. Furthermore, it would be highly desirable that the magnet can be shaped not only as a pancake but also into a complicated form appropriate for a given purpose. With regard to a wire material to be used for the magnet, it should exhibit a sufficiently high strength capable of withstanding the electromagnetic force produced by the magnet.

SUMMARY OF THE INVENTION

In view of above, it is a general object of the present invention to provide a superconducting magnet having excellent characteristics for advantageously overcoming the above-mentioned problems inherent to the conventional superconducting magnet which uses a compound superconducting wire material.

It is a more specific object of the present invention to provide a superconducting magnet which can be produced by a simple method which makes it possible to use a previously heat-treated wire material by introducing a reinforced and stabilized $Nb_3Sn$ wire material.

It is another object of the present invention to propose a compound superconducting magnet which can be made small and light, which can be formed into a relatively complicated shape, and which is capable of generating a sufficiently strong magnetic field suitable even for applications where alloy superconducting magnets have been exclusively used in the past.

It is a further object of the present invention to provide a method for producing such a superconducting magnet simply and at a low cost, from a compound superconducting wire material.

It is a still further object of the present invention to provide a method for producing a superconducting magnet simply and with easy handling, in which the conventional magnet production method applicable to alloy superconducting materials is modified in such a way as to be also applicable to compound superconducting wire materials.

The present inventors conceived for the first time that a high-strength reinforced and stabilized $Nb_3Sn$ wire material can be advantageously obtained by substituting a reinforcing, stabilizing agent such as a copper niobium or an alumina-dispersed copper for a high purity copper contained, as a stabilizing agent, in a conventional ultra-thin, multi-filamentary $Nb_3Sn$ wire material. When such a wire material is used as a material for producing a superconducting magnet, the wire can be wound into a coil in essentially the same manner as in the production of an alloy superconducting magnet, because the wire material has a strength which is sufficiently high to withstand the bending forces accompanied with the winding process.

The present invention has been accomplished based on the above-mentioned novel recognition.

According to one aspect of the present invention, there is provided a superconducting magnet comprising: a reinforced and stabilized superconducting wire material which is wound into an electromagnetic coil; said superconducting wire material comprising a compound superconducting substance, and a reinforcing, stabilizing agent which covers said compound superconducting substance.

The superconducting magnet according to the invention may include as a compound superconducting substance, for instance, $Nb_3Sn$, or $Nb_3Sn$ supplemented with titanium or tantalum. Furthermore, the reinforcing and stabilizing agent may comprise copper niobium or alumina-dispersed copper.

Advantageously, the reinforced and stabilized superconducting wire material takes a round or rectangular cross-section having an external dimension of 0.3 to 2 mm.

According to another aspect of the present invention, there is provided a method for producing a superconducting magnet, which comprises the steps of: preparing a reinforced and stabilized wire material comprising a raw material for a compound superconducting substance, and a reinforcing, stabilizing agent which covers said raw material; subjecting said reinforced and stabilized wire material to a preliminary heat treatment so that the wire material is transformed into a superconducting wire material; and winding said superconducting wire material into a coil.

With the production method according to the present invention, it is preferable for the reinforced and stabilized superconducting wire material to be a round or rectangular wire with an external dimension ranging from 0.3 to 2 mm, for the individual windings of the wire material to be bound together through a coat of an epoxy resin during the winding process, and for the wire material to be applied with a tension which is controlled properly during the winding process.

DETAILED DESCRIPTION OF THE PREFERRED EMBODIMENT

Figure 1:
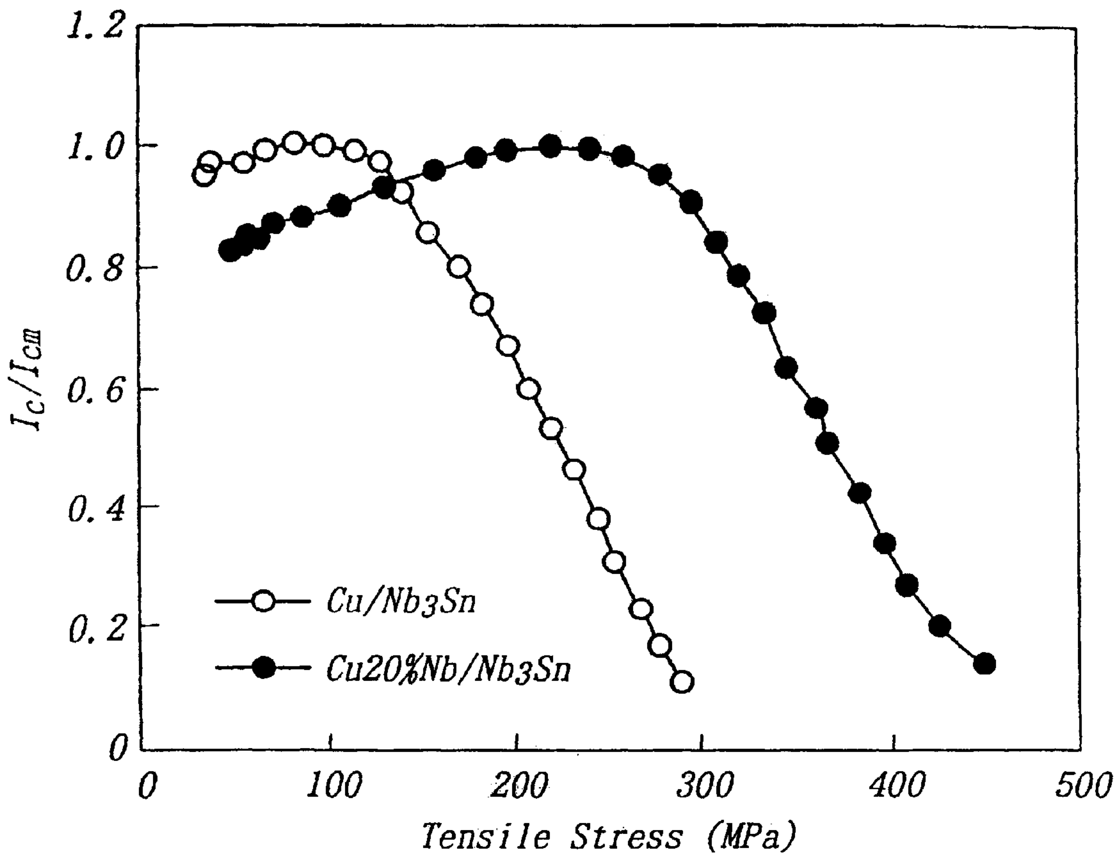
FIG. 1 is a graph showing the relationship of a critical current with a tension obtained from a CuNb/$Nb_3Sn$ reinforced and stabilized superconducting wire material used for the present invention, and also showing the same relationship obtained from a conventional Cu/$Nb_3Sn$ wire material.

The superconducting magnet according to the present invention comprises a reinforced and stabilized superconducting wire material which is comprised of a compound superconducting substance, and a reinforcing and stabilizing agent covering the compound superconducting substance, which is used instead of a conventional copper stabilizing agent. The superconducting wire material incorporating such a reinforcing, stabilizing agent has high strength, maintaining at the same time high stability.

Thus, for example, even when subjected to a heat treatment at about 700° C. for about 10 days, which is necessary for production of a proper $Nb_3Sn$ alloy, the reinforced and stabilized superconducting wire material made of $Nb_3Sn$ and in the form of a thin wire of 0.3 to 2 mm in diameter maintains a yielding stress of 250 to 300 MPa, and its critical current does not undergo any reduction even in the presence of bending strains up to 0.5%. This is far superior to a conventional compound superconducting wire material which has a yielding stress of 150 MPa and a tolerable strain of up to 0.2%. It is therefore possible to produce a novel superconducting magnet from the thus reinforced and stabilized $Nb_3Sn$ wire material in the form of a thin wire of 0.3 to 2 mm in external dimension.

The $Nb_3Sn$ wire material can be subjected to a heat treatment in advance as with an alloy superconducting wire material, and wound into a coil (react-and-wind method). The reinforced and stabilized material used in the present invention, even when heated at about 700° C. for 10 days which, if applied to a conventional wire material incorporating copper as a stabilizing agent, would anneal and soften copper contained therein, is mechanically strong, and maintains a yielding stress as high as 250 to 300 MPa, and thus allows winding into a coil with a tension applied thereto. Thus, in the case of the $Nb_3Sn$ wire material, it is possible to wind it into a coil under application of a high tension thereto and, hence, to apply a dense solenoid coil preparing technique to an $Nb_3Sn$ wire material as with an alloy superconducting wire material, and to use the resulting coil simply as a superconducting magnet without any modifications thereto.

In addition, an epoxy resin may be applied to the wire material during the winding process, thereby to firmly fix the individual windings by bonding them to each other while turning the wire material into a coil. Application of epoxy resin brings about the same effects as those obtained from a conventional vacuum coating of epoxy resin. Accordingly, even when a large compound superconducting magnet is to be produced, the winding of unreacted superconducting wire material into a coil, which has been required for the conventional method, is no longer necessary. This means that a specifically designed furnace for performing a vacuum heat treatment and a process for vacuum coating can be eliminated, and it is unnecessary to prepare excessively large facilities even when a large compound superconducting magnet is required. In this respect, the magnet according to the present invention is highly advantageous.

As mentioned above, for producing a superconducting magnet using the react-and-wind method, there is a still further technique known as the double pancake coil preparing method which makes it possible to make a loosely wound coil in the form of a pancake from a conventional $Nb_3Sn$ wire material susceptible to strains. However, with this method, the tolerable strain during fabrication is limited to 0.2% or less as well, depending on the property of the wire material used, and it is necessary to perform a double pancake winding with a wire material which is in the form of an extremely thin tape. A reinforcing means would be then required because the material is susceptible to magnetic forces, though the reinforcement poses a problem that a high mechanical strength of the material results in a superconducting magnet with a large internal diameter because the material has a limitation in its tolerable bending strains.

In this respect, the magnet according to the invention is advantageous since the wire material in the form of a wire with a round or rectangular cross-section having an external dimension of 0.3 to 2 mm as described above has a sufficient mechanical strength and it is therefore possible to apply the react-and-wind method under the limitation of bending strains of not more than 0.5%. Furthermore, since the wire material assumes the form of a round or rectangular wire, instead of a tape form, it allows a higher freedom degree in designing a superconducting magnet as regards the shape, and is not restricted by the limitations with respect to size and shape as are observed in the pancake winding. Accordingly, the superconducting wire material according to the present invention can be made into a superconducting coil having such a complex form as has been hitherto hardly applicable to a superconducting magnet made of a $Nb_3Sn$ compound, for example, into a dipole coil for a particle accelerator.

It is possible according to the present invention to wind an $Nb_3Sn$ compound into a coil while applying a high tension thereto, and thus to develop a wire winding technique appropriate for the magnetic force the resulting coil will develop, thereby optimizing the superconductivity of the magnet. Because a $Nb_3Sn$ compound is highly susceptible to strains, when it is exposed to 4.2K after having been thermally treated at 700° C., it undergoes a thermal contraction due to the temperature falling of 1000° C. so that its thermal conductivity at 4.2K deteriorates. However, with the method according to the present invention, it is possible to develop a technique canceling out the stress produced as a result of thermal contraction, by the stress induced by a tension applied to the wire during the winding process and the electromagnetic stress. Such stress relaxation leads to an improved superconductivity of the resulting magnet. With the conventional technique, it has been practically impossible to apply a high tension to a $Nb_3Sn$ wire while it is being wound into a coil, or to develop such a canceling-out technique. According to the present invention, on the contrary, it is possible to adjust the superconductivity of a $Nb_3Sn$ wire material by means of the high tension applied thereto.

The present invention will be described below in further detail.

The reinforced and stabilized superconducting wire material to be made into a magnet according to the invention is prepared by substituting a reinforcing, stabilizing material for a commonly used highly purity copper as a stabilizing agent to cover the superconducting substance.

The superconducting substance may include any known compound superconducting substances, and the representative example may include $Nb_3Sn$ compounds which may be added with at least one member selected from the group of titanium, tantalum, hafnium and gallium. Alternatively, as a matter of course, there may be used A15 type compound superconducting substances that have been put into practice in limited fields, such as $Nb_3Al$ and $V_3Ga$.

In the illustrated embodiments, the reinforcing, stabilizing agent may include, for example, a copper-niobium alloy, alumina-dispersed copper, copper-silver alloy or a copper-tantalum fiber. Because these reinforcing, stabilizing agents have a higher strength than does high purity copper, they produce a stronger wire material. In the past, copper alone was used as a stabilizing agent. When the heat treatment was performed at about 700° C. for at least one day to produce a $Nb_3Sn$ compound, the copper, of course, was annealed. The proof stress of the resulting wire material comprising the copper stabilizing agent fell to a level of about 50 MPa. In contrast, the reinforcing, stabilizing agents used in the illustrated embodiments maintain a proof stress of not less than 250 MPa, even when exposed to the same heat treatment as had been used for copper alone. Moreover, a wire material incorporating the reinforcing, stabilizing agents of the illustrated embodiments does not undergo any deterioration in electromagnetic properties, even when subject to strains up to 0.5%.

The preferred composition of such a copper-niobium is in the range of Cu—10 wt % Nb to Cu—40 wt % Nb. When alumina-dispersed copper is used, the preferred weight fraction of alumina to be dispersed is in the range of about 0.5 to 0.7 wt %.

Figure 2A:
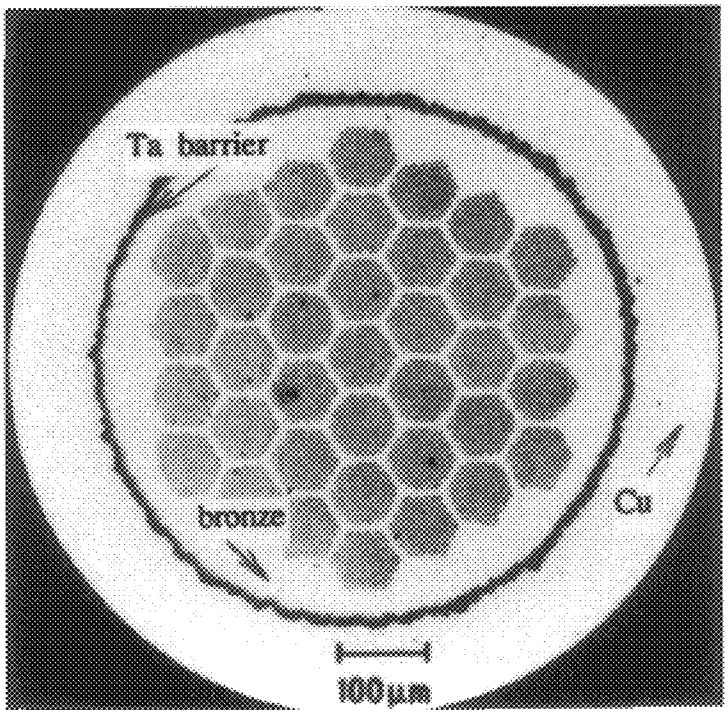
FIG. 2 shows photographs (a) and (b) representing the cross-sections of compound superconducting wire materials.
Figure 2B:
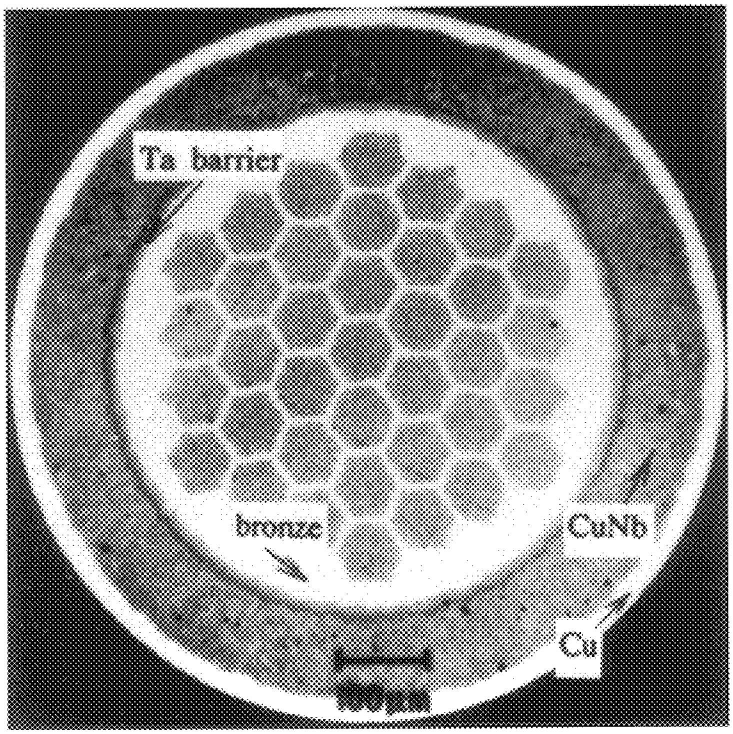

For production of a superconducting wire material to be used for the magnet according to the illustrated embodiments of the invention, the so-called bronze method, as outlined below, may be employed. Thus, it is possible to produce ultra-thin multi-filamentary wires with an external diameter of 0.3 to 2 mm. The bronze method is based on a finding that, when $Nb_3Sn$ is produced through a reaction between Nb and Sn, copper can act as a catalyst to facilitate the reaction. According to the bronze method, copper and tin form an alloy of Cu-Sn or bronze. The tin in the bronze more readily reacts with niobium than does tin alone, and thus a larger amount of $Nb_3Sn$ can be produced in a reaction with bronze than with tin alone. As shown in FIGS. 2_a_ and 2_b,_ a tantalum layer around the bronze region can act as a barrier between the bronze region and the outermost copper layer, thus preventing the diffusion of tin, in order that the outermost copper layer is essentially free from contamination with tin and is safely protected during the reaction. As discussed above, the preferred heat treatment is at 700° C. for about 10 days. Such bronze method may be applied to the present invention without requiring any modification.

The external dimension of the wire material should preferably be in the range of 0.3 to 2 mm. Conventionally, a wire material used for a wide-bore superconducting magnet is given a large diameter so that it can withstand a large force, and a conducting body of 3 to 5 mm in diameter is typically employed. However, when a wire material having a diameter of 3 to 5 mm is used and the tolerable bending strain has a limit of 0.2%, the resulting coil would have a diameter of 1500 to 2500 mm. The present invention is advantageous in this respect. That is to say, the wire material, even when turned into a thin wire of 0.3 to 2 mm in external dimension, has a sufficient strength. Moreover, since the wire material tolerates bending strains as much as 0.5%, it allows the production of coil with a diameter as small as 60 mm.

FIG. 1 is a graph showing the relationship between the critical current and tensile stress of a $CuNb/Nb_3Sn$ wire material containing CuNb as a reinforcing, stabilizing agent maintained at 4.2K, together with the same relationship observed for a conventional $Cu/Nb_3Sn$ wire material as a comparison. The physical properties of the test wire materials are as follows.

| | |
|---|---|
| Diameter of test wire material: | 1.0 mm |
| Ratio of Cu/CuNb/non-Cu component: | 0.41/0.68/1.0 |
| Diameter of filament: | 4.0 μm |
| Number of filaments: | 7849 |
| Bronze ratio: | 3.9 |
| Barrier material: | Ta |
| Element added to Nb core: | Ti |

It can be appreciated from FIG. 1 that the $CuNb/Nb_3Sn$ wire material of the illustrated embodiment, as shown by the dark circles, does not have a reduction in critical current even when exposed to a stress as high as 200 to 300 MPa. This is in contrast to the wire material of the prior art, as shown by the open circles, wherein only Cu is used to stabilize the wire, and the critical current is reduced by about half within the same stress range.

FIG. 2 shows photographs of the cross-sections of the compound superconducting wire materials. Photograph (a) represents a $(Cu/(Nb,Ti)_3Sn)$ wire material supplemented with Cu/Ti of which Cu acts as a stabilizer, and photograph (b) represents a $CuNb/(Nb, Ti)_3Sn$ wire material supplemented with CuNb/Ti of which CuNb acts as a reinforcing, stabilizing agent, and suitable for the magnet according to the invention.

Such a reinforced and stabilized superconducting wire material is submitted to a specified heat treatment to be made into a superconducting body, which is then wound into a coil to serve as a superconducting magnet.

During the winding process, the wire material is preferably wound into a coil while being applied, for example, with a tension of 50 to 100 MPa, as if it were an alloy superconducting wire material.

Further, since the reinforces and stabilized superconducting wire materials in the form of a round or rectangular wire with an external dimension of 0.3 to 2 mm, it allows easy handling, in contrast with the conventional compound superconducting wire material in the form of a tape, and thus it can be wound into coils of various shapes.

During the winding process, an epoxy resin may be applied to bind together the individual windings of the wire material to complete a coil, which can obviate the need for facilities such as a vacuum coating device, as mentioned above.

More preferably, the tension applied during winding of the wire into a coil is adjusted so as to cancel out the stress due to thermal contraction by the applied tension and also by the stress due to electromagnetic force. With a superconducting magnet, usually a strong electromagnetic force acts on the inner part of coil, and the electromagnetic force becomes weaker as it approaches the outer part of coil. In addition, the magnet is generally divided into multiple components so that it can develop a magnetic field more efficiently than a magnet with no such division. The wire may be wound under a minimum tension barely allowing winding for the inner part of coil, so that it can overcome the stronger electromagnetic force developed there and the sum of the electromagnetic force and the winding tension becomes substantially equal to the maximum critical current, as shown in FIG. 1. For the outer part of coil, however, the wire may be wound under a high tension so that the same sum becomes substantially equal to the maximum critical current. Such operation may be repeated for individual coil components, and serves to further enhance the superconductivity of the magnet.

The wire prepared according to the present invention may be preferably used for the magnets as described below.

Since a wide-bore magnet must become large, realization of a compact arrangement is highly desirable. The reinforced and stabilized $Nb_3Sn$ wire material prepared according to the present invention can be advantageously used, thereby making it possible to reduce the size of resulting coil by one third to half that of a conventional coil.

For the production of a cryocooled superconducting magnet not dependent on the use of liquid helium, it is highly desirable to make it in a small size. When a reinforced and stabilized $Nb_3Sn$ wire material is used for the production of a wide-bore superconducting magnet according to the invention, the magnet may be reduced in size suitable for use as a cryocooled superconducting magnet.

For a $Nb_3Sn$ wire material to be made into a wide-bore superconducting magnet, and for the magnet to be made as small as possible, the only method hitherto available was to carry out heat treatment only after the winding process. This requires introduction of a large furnace for thermally treating a large coil. When the superconducting magnet is made from a reinforced and stabilized $Nb_3Sn$ wire material according to the invention, the heat treatment is applied only to the wire material before the winding process, which makes it unnecessary to introduce a large furnace to accommodate the large coil to apply the heat treatment thereto.

It is extremely difficult, if not impossible, to apply an epoxy resin to a large coil to serve as a wide-bore superconducting magnet, under vacuum. When a reinforced and stabilized $Nb_3Sn$ is wound under a high tension into a superconducting magnet according to the invention, it is possible to apply the epoxy resin to the wire while the wire is being wound, which makes it unnecessary to introduce a furnace for vacuum coating.

Proper adjustment of the tension applied to the wound wire serves to optimize the superconductivity of the resulting coil divided into multiple components.

It will be appreciated from the foregoing description that, according to the present invention, it is possible to produce a superconducting magnet by the react-and-wind method, since a reinforced and stabilized wire material is used for the production of a compound superconducting magnet. It is therefore possible to obviate the need for specifically designed furnaces for vacuum thermal treatment and for vacuum coating. Further, since the wire material can withstand the bending strains of 0.5%, or 2.5 times as high as those tolerated by conventional wire materials, it is possible to design the shape of coil with a higher degree of freedom.

The wire material according to the invention can be advantageously used as a material for a magnet from which a wide-bore and strong magnetic field are required, such as a wide-bore superconducting magnet for the measurement of physical properties of an object, or superconducting magnet for particle accelerator, for linear motor cars, for electric generators or for elementary particle detectors.

What is claimed is:

1. A method for producing a superconducting magnet comprising the steps of:

preparing a reinforced and stabilized wire material comprising a raw material for a compound superconducting substance and a reinforcing, stabilizing agent which covers said raw material;

heating said reinforced and stabilized wire material to transform the wire material into a superconducting wire; and winding said superconducting wire into a magnetic coil under a tension of not less than 50 MPa, said method further comprising the step of applying an epoxy resin to the superconducting wire while it is wound into a coil, thereby bonding individual windings of the wire material to each other.

2. The method of claim 1, wherein said reinforcing, stabilizing agent comprises a material selected from the group consisting of copper-niobium alloy, alumina-dispersed copper, copper-silver alloy and copper-tantalum fiber.

3. A method for producing a superconducting magnet comprising the steps of:

preparing a reinforced and stabilized wire material comprising a raw material for a compound superconducting substance and a reinforcing, stabilizing agent which covers said raw material;

heating said reinforced and stabilized wire material to transform the wire material into a superconducting wire; and winding said superconducting wire into a magnetic coil under a tension of not less than 50 MPa, wherein said reinforcing, stabilizing agent comprises a material selected from the group consisting of copper-niobium alloy, alumina-dispersed copper, copper-silver alloy and copper-tantalum fiber.

4. The method for producing a superconducting magnet according to claim 1 or 3, wherein the reinforced and stablizied wire material comprises a wire with a round cross-section having an external diameter of 0.3 to 2 mm.

5. The method for producing a superconducting magnet according to claim 1 or 3, wherein the reinforced and stablizied wire material comprises a wire with a rectangular cross-section having an external diameter of 0.3 to 2 mm.

6. The method of claim 1 or further comprising the step of adjusting the tension of the superconducting wire while it is wound into a coil.

7. The method of claim 1 or 3, wherein the tension of the superconducting wire while it is wound into a coil is between about 200 MPa and 350 MPa.

8. The method of claim 1 or 3, wherein said compound superconducting substance comprises a Nb—Sn compound.

9. The method of claim 8, wherein said compound superconducting substance further comprises a material selected from the group consisting of titanium, tantalum, hafnium, and gallium.

10. The method of claim 1 or 3, wherein the heat treatment comprises heating the wire material to about 700° C. for at least one day.

* * * * *